United States Patent [19]
DeMicheli

[11] Patent Number: 5,534,813
[45] Date of Patent: Jul. 9, 1996

[54] ANTI-LOGARITHMIC CONVERTER WITH TEMPERATURE COMPENSATION

[75] Inventor: Marco DeMicheli, Como, Italy

[73] Assignee: SGS-Thomson Microelectronics S.r.l., Milan, Italy

[21] Appl. No.: 201,208

[22] Filed: Feb. 24, 1994

[30] Foreign Application Priority Data

Feb. 26, 1993 [EP] European Pat. Off. ............. 93830079

[51] Int. Cl.$^6$ .............................. G06F 7/556; G06G 7/20
[52] U.S. Cl. .............................. 327/346; 327/350
[58] Field of Search ...................... 327/346–353, 327/362, 513, 560, 561, 562, 563

[56] References Cited

U.S. PATENT DOCUMENTS

| | | | |
|---|---|---|---|
| 3,612,902 | 10/1971 | Moose | 327/513 |
| 3,728,636 | 4/1973 | Hill | 327/350 |
| 3,914,624 | 10/1975 | Jackson | 327/346 |
| 4,168,492 | 9/1979 | Uya | 327/346 |
| 5,200,655 | 4/1993 | Feldt | 327/346 |

FOREIGN PATENT DOCUMENTS 2170627  8/1986  United Kingdom ............. G06G 7/16

*Primary Examiner*—Toan Tran
*Attorney, Agent, or Firm*—David V. Carlson; Seed and Berry

[57] ABSTRACT

An anti-logarithmic type converter circuit, with temperature compensation, includes a diode connected between a unity gain, non-inverting interface circuit and a low-impedance reference voltage circuit. A thermal compensation circuit is connected between the converter input and the interface circuit. The thermal compensation circuit includes current mirror circuits having a gain higher than one and their output currents linearly dependent on temperature.

16 Claims, 2 Drawing Sheets

ANTI-LOGARITHMIC CONVERTER WITH TEMPERATURE COMPENSATION

TECHNICAL FIELD

This invention relates to circuits for converting electric quantities, in particular to monolithically integrated converter circuits of the anti-logarithmic or linear-exponential type.

BACKGROUND OF THE INVENTION

Anti-logarithmic or linear-exponential type converter circuits are used in a number of applications, such as automatic gain control systems where a signal, whose amplitude may vary within a wide range, is to be amplified such that a signal having a predetermined constant maximum amplitude can be output.

The simplest way of obtaining a linear-exponential conversion is to utilize the exponential characteristic of a bipolar junction of the PN type.

In this case, the converter circuits as designed by the skilled technician would be represented schematically by an operational amplifier having the cathode of a diode connected to its inverting input terminal, with the latter being connected to the output terminal through a resistor. The non-inverting input terminal of the amplifier is connected to a ground point. The anode of the diode is the input terminal.

For opposite polarity signals, the diode connection would be reversed.

The operational amplifier may be implemented to varying degrees of complexity using conventional techniques.

That circuit arrangement has, however, an inherent problem in that the value of the anode-cathode voltage of the diode is tied to such variations in the processing parameters as the "spread", and above all, temperature.

SUMMARY OF THE INVENTION

The present invention provides a linear-exponential converter circuit which, while utilizing the exponential characteristic of a bipolar junction of the PN type, is unaffected by variations in processing parameters and can be compensated for temperature in a simple and effective manner. The linear-exponential converter circuit under the present invention comprises a diode connected between a low-impedance reference voltage and a non-inverting interface circuit having unity gain, as specified in claim 1.

The features and advantages of a converter circuit according to the invention will become apparent from the following description of an embodiment thereof, given by way of example and not of limitation with reference to the accompanying drawings.

DETAILED DESCRIPTION OF THE INVENTION

Figure 1A:
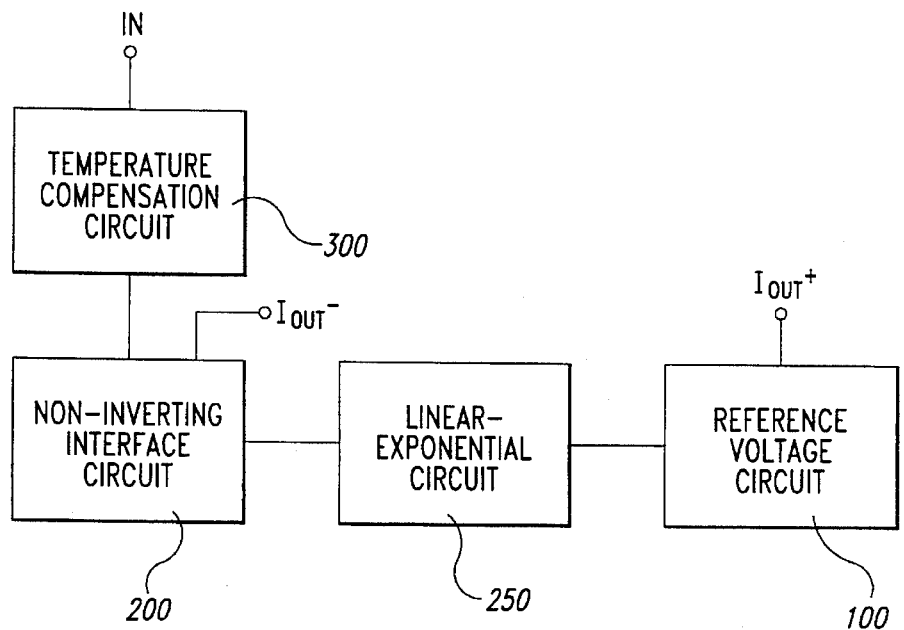
FIG. 1A is a block diagram of the anti-logarithmic converter circuit of the present invention.
Figure 1B:
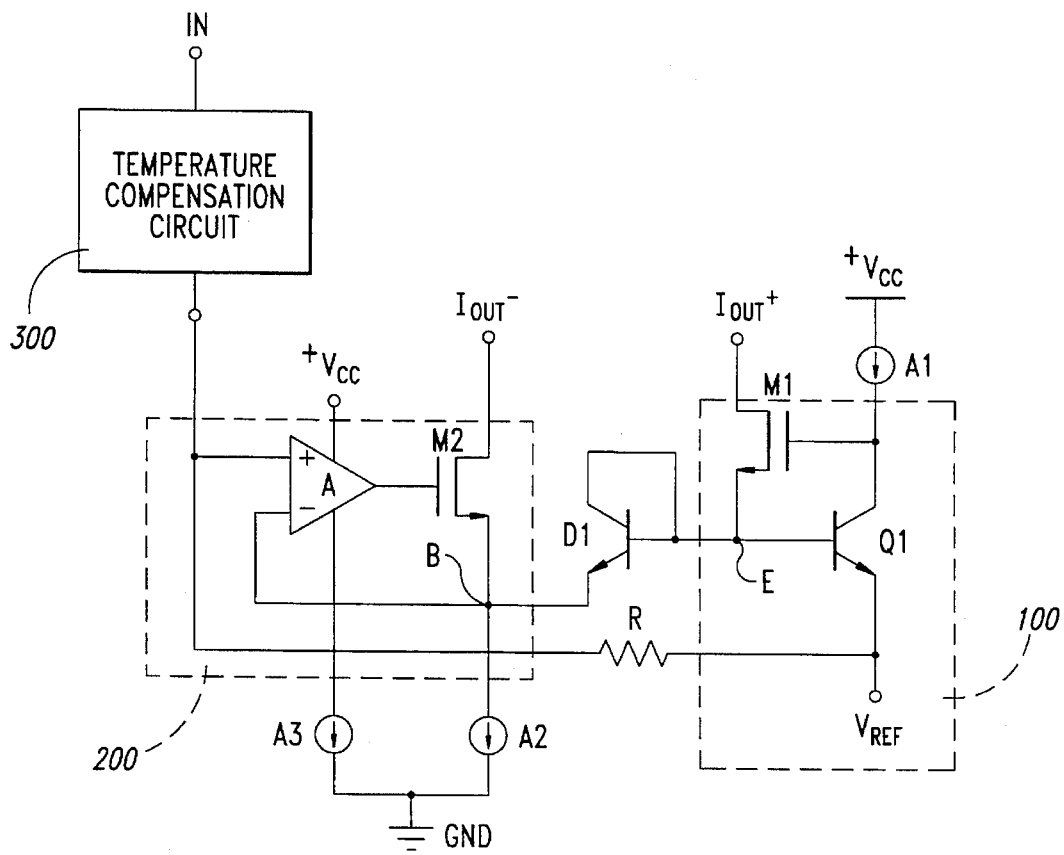
FIG. 1B is a partial schematic, partial block diagram of the anti-logarithmic converter circuit of FIG. 1A.

FIG. 1A shows an anti-logarithmic converter circuit of the present invention which essentially comprises a reference voltage circuit 100, a unity gain non-inverting interface circuit 200, and a linear-exponential circuit 250 electrically coupled therebetween. As shown in more detail in FIG. 1B, the reference voltage circuit 100 includes a first field effect transistor M1 and a bipolar transistor Q1 both coupled to one end of a diode D1. The interface circuit 200 includes an operational amplifier A whose non-inverting input terminal is coupled to an input terminal to the converter circuit, and a second field effect transistor M2 coupled between an output terminal of the operational amplifier and the other end of the diode D1. A resistor R interconnects a non-inverting input terminal of the operational amplifier A and the bipolar transistor Q1. An optional temperature compensation circuit 300 can precede the input to converter circuit.

Figure 2:
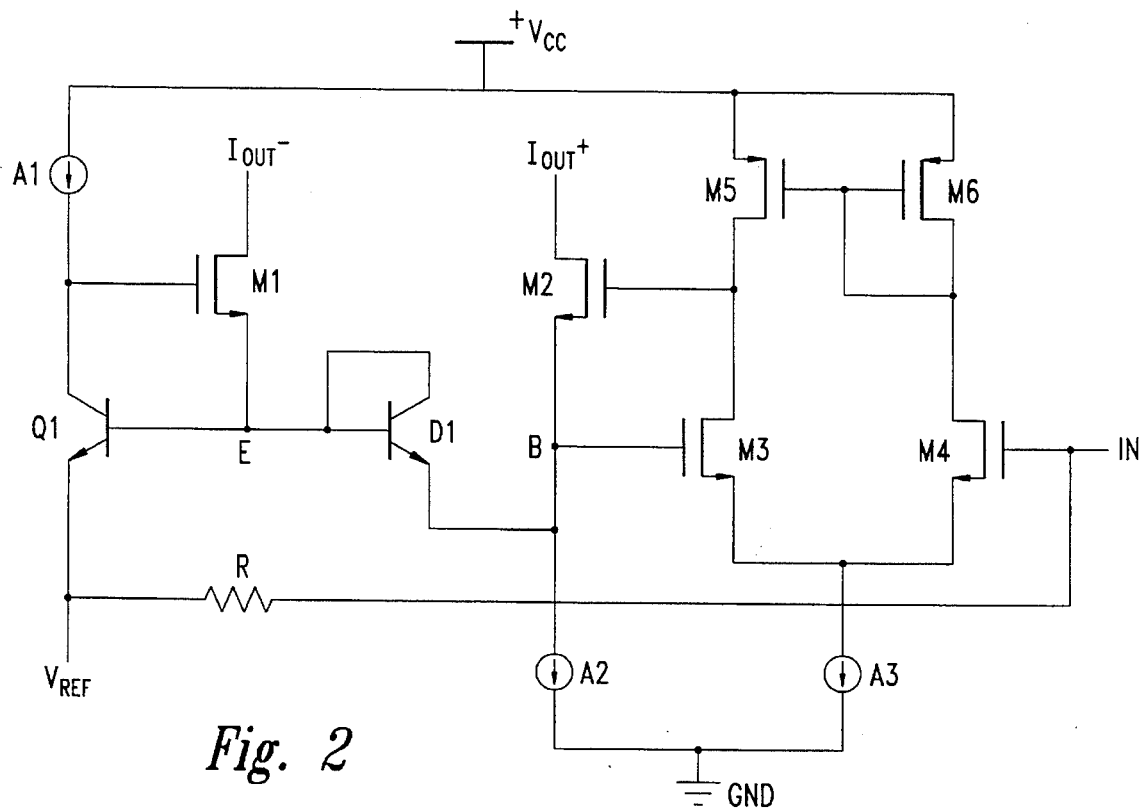
FIG. 2 shows a circuit diagram of a converter according to the invention.

FIG. 2 provides a more detailed description of the converter circuit of the present invention. The diagram of FIG. 2 shows a converter having a current input and current outputs, which converter can solve the problem of voltage variations at a forward biased junction originated from processing spread.

The converter circuit comprises the diode D1, usually provided by a transistor, preferably a bipolar transistor, having its base and collector shorted together. This transistor provides the bipolar junction for the diode and thus the desired exponential characteristics of a bipolar junction.

The first field-effect transistor M1 is connected to the anode of the diode D1 through its source terminal.

The second field-effect transistor M2 is connected to the cathode of the diode through its source terminal.

The drain terminals of the transistors M1 and M2 are converter output terminals. The output currents have the same directions and different values. The exponential information is a present difference therebetween, not shown in the drawings.

The anode of the diode D1 is also connected to the base terminal of the bipolar transistor Q1, whose emitter terminal is connected to a reference voltage potential VREF, whilst the collector terminal is connected both to the gate terminal of the transistor M1 and, via a constant current generator A1, to a positive voltage potential or supply pole +Vcc.

The cathode of the diode D1 is also connected to an input terminal of a differential structure composed of two field-effect transistors, M3 and M4, and via a constant current generator A2, to a ground point GND.

Both source terminals, of the transistors M3 and M4, are connected to a ground point through a constant current generator A3.

The drain terminal of the transistor M4 is connected to the input leg of a current mirror circuit structure comprising two transistors, M5 and M6, connected to the positive pole +Vcc.

The output leg of that current mirror circuit structure is both connected to the gate terminal of transistor M2 and the drain terminal of transistor M3.

The gate terminal of transistor M3 is connected to the cathode of the diode D1, and the other input of the differential structure, i.e., the gate terminal of transistor M4, would also form the input terminal IN of the converter in those applications where compensation for temperature is not required.

Figure 3:
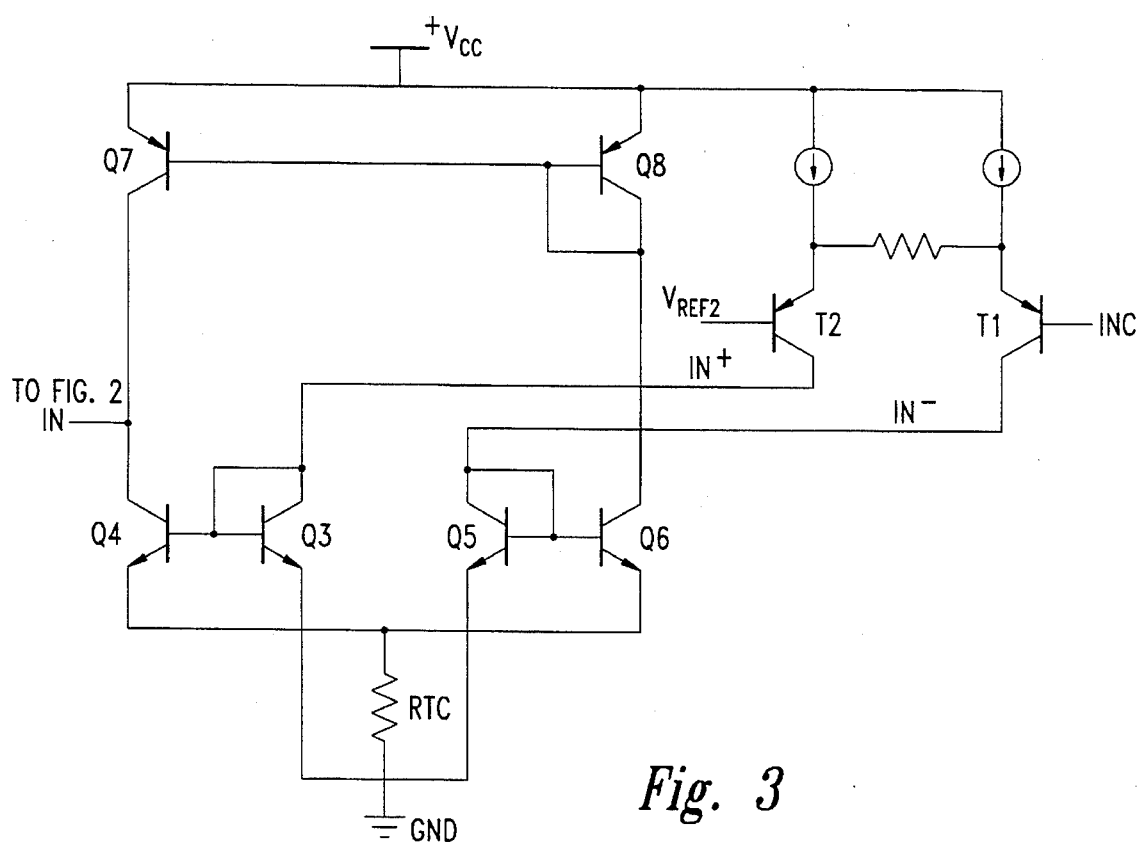
FIG. 3 shows a circuit diagram of a temperature compensatory means which may be added to the circuit diagram of FIG. 1.

Conversely, where compensation for temperature is a prerequisite, the circuit shown diagrammatically in FIG. 3 would be connected to the gate terminal of transistor M4.

In the circuit diagram of FIG. 2, the field-effect transistors may obviously be replaced with bipolar transistors.

The combination of the differential structure M3, M4 and the current mirror circuit structure M5, M6 constitutes the operational amplifier having its inverting input terminal and output terminal respectively connected to the source and gate terminals of transistor M2.

The combination of the operational amplifier and the transistor M2 may then be regarded as the non-inverting interface circuit 200 having unity gain. The transistor designated Q1, along with its connections, may also be considered to be an operational amplifier having its inverting input and output terminals respectively connected to the source and the gate terminals of the transistor M1, and having its non-inverting input terminal connected to the reference voltage VREF, through a diode which forms the emitter-base bipolar junction for the transistor Q1 itself.

The emitter terminal of the transistor Q1 is coupled to the input terminal IN via the resistor R.

Shown in FIG. 3 is the circuit means of thermal compensation 300 which ensures excellent temperature compensation with the converter circuit shown in FIG. 2.

The input terminal INC of the converter is coupled, through a differential structure comprising two transistors T1 and T2, to input legs IN+ and IN− of first and second current mirror circuits comprising two bipolar transistors Q3 and Q4 and two bipolar transistors Q5 and Q6, respectively.

Such first and second current mirror circuits are connected for polarization to a ground point GND. A resistor RTC is connected between the transistors Q4, Q6, forming the output legs of the two current mirror circuits, and ground.

A third current mirror circuit, comprising two transistors Q7 and Q8, is connected for polarization to the positive pole +VCC.

The input leg of the third current mirror circuit is connected at node N2 to the output leg of the second current mirror circuit, and the output leg of the third current mirror is connected at node N1 to the input terminal IN of the circuit in FIG. 2 and to the output terminal of the first current mirror circuit.

According to the invention, the current gain of the first and second current mirror circuits, as implemented by bipolar transistors, is higher than 1.

The current gain of the third current mirror circuit, which circuit may be implemented by either bipolar or field-effect transistors, is instead equal to unity.

In the circuit shown in FIG. 2, the transistors Q1 and M1 generate, as mentioned above, a low-impedance reference at point E which is equal to the value of the reference voltage VREF plus the base-emitter voltage of the transistor Q1.

At rest, with the input current being zero, the voltages at nodes B and E are the same as VREF. As the input current varies, the voltage at node B will vary linearly therewith due to the voltage drop across the resistor R, and accordingly, with point E at a low impedance, the voltage across the diode will also vary linearly, whereby an exponential variation is produced in the output current. Where the resistor R is omitted, the converter would have to be voltage driven.

The present difference between the output currents Iout+ and Iout− from the transistors M1 and M2 is limited to within a range having predetermined maximum positive and negative values.

However, the circuit of FIG. 2 has a drawback in that its transfer function is dependent on temperature.

With the circuit of FIG. 3, an unbalance can be established between points B and E which increases with temperature, to thereby compensate for the decrease in transconductance of the transistor from which the diode D1 is formed.

In fact, the ratio of the currents flowed through both bipolar transistors of the first current mirror circuit (Q3, Q4) and those of the second current mirror circuit (Q5, Q6) increases linearly with temperature by virtue of the resistor RTC provided, whereby the linear decrease can be erased in the transconductance of the transistor from which the diode D1 is formed.

Through the resistor RTC, and appropriate selection of the area ratio between the transistors of the first and the second current mirror circuits of FIG. 3, a converter can be provided which fully achieves the objects of the invention.

The voltages VREF and VREF2 are provided by any acceptable circuit that can provide a voltage and current at the level needed for the circuits, many suitable such circuits being known by those of ordinary skill in the art.

While one embodiment of the invention has been illustrated and described by way of example, changes and variations may be made thereunto within the scope of this inventive concept. Therefore, the scope of this invention is to be determined entirely by reference to the following claims.

I claim:

1. A converter of the anti-logarithmic type, characterized in that it comprises a unity gain non-inverting interface circuit having at least one input terminal, coupled to an input terminal of the converter, a first output terminal, forming a first output terminal of the converter, and a second output terminal, connected to a first terminal of a bipolar junction circuit element which has a second terminal connected to a reference voltage circuit means.

2. A converter according to claim 1, characterized in that the bipolar junction circuit element is a diode, and the first and second terminals are the diode cathode and anode, respectively.

3. A converter according to claim 1, characterized in that the interface circuit comprises an operational amplifier having an inverting input terminal, a non-inverting input terminal, and an output terminal; and a first transistor having first and second terminals and a control terminal; the non-inverting input terminal of the operational amplifier forming the input terminal of the interface circuit, the output terminal of the operational amplifier being connected to the control terminal of the first transistor, whose first terminal is connected to the first terminal of the bipolar junction circuit element, the inverting terminal of the operational amplifier and a first terminal of a supply voltage generator, through a constant current generator; the second terminal of the first transistor forming the first output terminal of the converter.

4. A converter according to claim 1, characterized in that the reference voltage circuit means comprises an operational amplifier having an inverting input terminal, a non-inverting input terminal, and an output terminal, respectively connected to the second terminal of the bipolar junction circuit element, a voltage reference, and the control terminal of a second transistor having a first terminal connected to the second terminal of the bipolar junction circuit element and a second terminal forming a second output terminal of the converter.

5. A converter according to claim 3, characterized in that the operational amplifier comprises a differential amplifier having first and second input terminals, first and second output terminals, and a terminal for connection to the first terminal of the supply voltage generator through a constant current generator; and a current mirror circuit connected to a second terminal of the supply voltage generator and having input and output legs respectively connected to the first and the second output terminals of the differential amplifier; the first input terminal of the differential amplifier forming the input terminal of the interface circuit and the second input terminal of said differential amplifier being connected to the first terminal of the first transistor whose control terminal is connected to the second output terminal of the differential amplifier.

6. A converter according to claim 5, characterized in that the first transistor is a field-effect transistor.

7. A converter according to claim 1, characterized in that the reference voltage circuit means comprises a bipolar transistor being connected with collector and emitter terminals thereof serially to a constant current generator, between one terminal of a supply voltage generator and a reference voltage, and having a base terminal connected to the second terminal of the bipolar junction circuit element; and a field-effect transistor connected between said second terminal of the bipolar junction circuit element and a linking node between the current generators and the bipolar transistor, with a gate terminal being connected to said node.

8. A converter according to claim 1, characterized in that, connected between the interface circuit and the input terminal of the converter is a thermal compensation circuit means comprising current mirror circuits with bipolar transistors.

9. A converter according to claim 8, wherein the thermal compensation circuit means comprises first and second current mirrors having a gain higher than one and comprising bipolar transistors, both current mirrors having input legs connected between a differential input stage and a first terminal of a supply voltage generator, said first current mirror having an output leg connected between a first terminal of a resistor and a first circuit node, the second current mirror having an output leg connected between the first terminal of the resistor and a second circuit node, a second terminal of the resistor coupled to the first terminal of the supply voltage generator, the thermal compensation circuit means further comprising a third current mirror having an output leg and an input leg connected between a second terminal of the supply voltage generator and the first and second circuit nodes respectively, the first circuit node being connected to the input terminal of the unity gain non-inverting interface circuit.

10. A converter circuit comprising:

a first voltage potential terminal;

a second voltage potential terminal;

a ground voltage potential terminal;

a first converter output terminal;

a diode having first and second terminals;

a reference voltage circuit coupled between the first terminal of the diode and the second voltage potential terminal, the reference voltage circuit having a first output terminal coupled to the first converter output terminal, the reference voltage circuit including a first transistor coupled between the first voltage potential terminal and the second voltage potential terminal, the first transistor having a control terminal coupled to the first terminal of the diode, and a second transistor coupled between the first terminal of the diode and the output terminal, the second transistor having a control terminal coupled to the first voltage potential terminal; and a unity gain, non-inverting interface circuit coupled to the second terminal of the diode and coupled to the first voltage potential terminal and the ground potential terminal, the unity gain, non-inverting interface circuit coupled to an input terminal of the converter circuit.

11. The converter circuit according to claim 10, further comprising a first current source coupled between the first voltage potential terminal and the first transistor.

12. The circuit according to claim 10 wherein the first transistor is a bipolar transistor.

13. A converter circuit comprising:

a first voltage potential terminal;

a second voltage potential terminal;

a ground voltage potential terminal;

a first converter output terminal;

a diode having first and second terminals;

a reference voltage circuit coupled between the first terminal of the diode and the second voltage potential terminal, the reference voltage circuit having a first output terminal coupled to the first converter output terminal; and a unity gain, non-inverting interface circuit coupled to the second terminal of the diode and coupled to the first voltage potential terminal and the ground potential terminal, the unity gain, non-inverting interface circuit coupled to an input terminal of the converter circuit, the unity gain, non-inverting interface circuit including a transistor coupled between the second terminal of the diode and a second output terminal, and an operational amplifier having a non-inverting input terminal coupled to the input terminal of the converter circuit, an inverting input terminal coupled to the second terminal of the diode, and an output terminal coupled to a control terminal of the transistor.

14. The converter circuit according to claim 13, further comprising a resistor coupled between the non-inverting input terminal of the operational amplifier and the second voltage potential terminal.

15. The converter circuit according to claim 13 wherein the operational amplifier is coupled to the first voltage potential terminal, and is coupled to the ground voltage potential terminal through a second current source.

16. A converter circuit comprising:

a first voltage potential terminal;

a second voltage potential terminal;

a ground voltage potential terminal;

a converter input terminal;

a converter output terminal;

a diode having first and second terminals;

a reference voltage circuit coupled between the first terminal of the diode and the second voltage potential terminal, the reference voltage circuit having an output terminal coupled to the converter output terminal;

a unity gain non-inverting interface circuit coupled to the second terminal of the diode, the first voltage potential terminal, and the ground voltage potential terminal, the unity gain, non-inverting interface circuit having an input terminal; and a temperature compensation circuit coupled between the converter input terminal and the input terminal of the unity gain, non-inverting interface circuit, the temperature compensation circuit including a differential input stage having an input coupled to the converter input terminal and having a pair of differential outputs, a first current mirror having an input leg coupled to a first of said differential outputs and having an output leg coupled to said input terminal of said unity gain, non-inverting interface circuit, a second current mirror having an input leg coupled to a second of said differential outputs and having an output leg, and a third current mirror having an input leg coupled to said output leg of said second current mirror and having an output leg coupled to said input terminal of said unity gain, non-inverting interface circuit.

* * * * *